(12) United States Patent
Wang et al.

(10) Patent No.: US 11,249,150 B2
(45) Date of Patent: Feb. 15, 2022

(54) SPIN VALVE AND SPINTRONIC DEVICE COMPRISING THE SAME

(71) Applicant: Institute of Semiconductors, Chinese Academy of Sciences, Beijing (CN)

(72) Inventors: Kaiyou Wang, Beijing (CN); Ce Hu, Beijing (CN)

(73) Assignee: Institute of Semiconductors, Chinese Academy of Sciences, Beijing (CN)

( * ) Notice: Subject to any disclaimer, the term of this patent is extended or adjusted under 35 U.S.C. 154(b) by 125 days.

(21) Appl. No.: 16/783,041

(22) Filed: Feb. 5, 2020

(65) Prior Publication Data

US 2021/0148998 A1    May 20, 2021

(30) Foreign Application Priority Data

Nov. 14, 2019  (CN) .......................... 201911124046.3

(51) Int. Cl.
   *G01R 33/09*   (2006.01)
   *B82Y 25/00*   (2011.01)
   *H01L 43/10*   (2006.01)

(52) U.S. Cl.
   CPC ............ *G01R 33/093* (2013.01); *B82Y 25/00* (2013.01); *H01L 43/10* (2013.01)

(58) Field of Classification Search
   CPC ........ G01R 33/093; B82Y 25/00; H01L 43/10
   USPC ....................................................... 257/421
   See application file for complete search history.

(56) References Cited

FOREIGN PATENT DOCUMENTS

| CN | 1053229 | 6/2000 | |
|---|---|---|---|
| CN | 101527420 | 9/2009 | |
| CN | 103544983 | 1/2014 | |
| CN | 107546322 | 1/2018 | |
| CN | 109904291 | 6/2019 | |
| CN | 110190182 | 8/2019 | |
| WO | WO-2019075481 A * | 4/2019 | ......... H01F 10/3218 |

OTHER PUBLICATIONS

Shengxue Yang et al. (van der Waals Magnets: Material Family, Detection and Modulation of Magnetism, and Perspective in Spintronics, Advanced Science https://doi.org/10.1002/advs.202002488, Dec. 6, 2020) (Year: 2020).*
CN Office Action in Chinese Appln. No. 201911124046.3, dated Feb. 1, 2021, 13 pages with English Translation.

* cited by examiner

*Primary Examiner* — Jami Valentine Miller
(74) *Attorney, Agent, or Firm* — Fish & Richardson P.C.

(57) ABSTRACT

Exemplary embodiments of the present disclosure provide a spin valve and a spintronic device comprising the same. The spin valves may comprise two or more magnetic layers stacked in sequence, wherein any two adjacent magnetic layers among the two or more magnetic layers have different coercive forces, and at least one of the any two adjacent magnetic layers is a van der Waals magnetic layer, wherein the van der Waals magnetic layer refers to a magnetic layer made of a van der Waals magnetic material.

8 Claims, 5 Drawing Sheets

SPIN VALVE AND SPINTRONIC DEVICE COMPRISING THE SAME

CROSS-REFERENCE TO RELATED APPLICATION(S)

This application claims the priority of Chinese Patent Application No. 201911124046.3 filed on Nov. 14, 2019, the disclosure of which is incorporated herein by reference in its entirety as a reference.

TECHNICAL FIELD

The present disclosure generally relates to the fields of spintronics and spintronic device, and more particularly, to a spin valve and a spintronic device comprising the same.

BACKGROUND

Currently used spin valves are mainly based on magnetically decoupling by inserting a nonmagnetic spacer layer between two magnetic layers. This enables the magnetization of the two magnetic layers to have a parallel or an antiparallel configuration, resulting in magnetoresistance effects. The magnetoresistance effects in such sandwiched structure of "magnetic layer/spacer layer/magnetic layer" are the cornerstone of magnetic sensing, data storage and processing techniques. Further, information industry based on giant magnetoresistance (GMR) effect and tunnel magnetoresistance (TMR) effect has been booming for more than 20 years. However, because it is difficult to maintain the spin momentum of electrons during passing through the spacer layer and interfaces between the spacer layer and the magnetic layers, the development of the spin valve which decouples two magnetic layers magnetically by the nonmagnetic spacer layer is limited. In addition, the spin valve of the sandwiched structure goes against device miniaturization and industrialization.

Therefore, there is a need for a spin valve without spacer layer and spintronic devices comprising the same.

SUMMARY

The present disclosure is aimed at addressing some or all of the above-mentioned problems.

According to an aspect of the present disclosure, there is provided a spin valve, which may comprise two or more magnetic layers stacked in sequence, wherein any two adjacent magnetic layers among the two or more magnetic layers have different coercive forces, and at least one of the any two adjacent magnetic layers is a van der Waals magnetic layer, wherein the van der Waals magnetic layer refers to a magnetic layer made of a van der Waals magnetic material.

In one embodiment, each van der Waals magnetic layer may be made of the same van der Waals magnetic material.

In another embodiment, at least one van der Waals magnetic layer among the two or more magnetic layers may have a different van der Waals magnetic material from another van der Waals magnetic layer among the two or more magnetic layers.

In another embodiment, the van der Waals magnetic layer may be made of at least one of a van der Waals magnetic metal, a van der Waals magnetic semimetal, a van der Waals magnetic semiconductor, a van der Waals magnetic superconductor, a van der Waals Magnetic insulator, a van der Waals ferromagnetic material, a van der Waals antiferromagnetic material, a van der Waals in-plane magnetic anisotropic material, a van der Waals out-of-plane magnetic anisotropic material, an organic van der Waals magnetic material, and an inorganic van der Waals magnetic material.

In another embodiment, a non-van der Waals magnetic layer among the two or more magnetic layers may be made of same or different chemically bonded magnetic materials.

In another embodiment, a non-van der Waals magnetic layer among the two or more magnetic layers may be made of at least one of a magnetic metal, a magnetic semimetal, a magnetic semiconductor, a magnetic superconductor, a magnetic insulator, a ferromagnetic material, an antiferromagnetic material, an in-plane magnetic anisotropic material, an out-of-plane magnetic anisotropic material, an organic magnetic material, and an inorganic magnetic material.

In another embodiment, at least one of the two or more magnetic layers may have a fixed magnetization direction, and the other magnetic layer(s) may have an unfixed magnetization direction.

In yet another embodiment, the spin valve further comprises a pinning layer disposed above and/or below the at least one magnetic layer and configured to fix a magnetization direction of the at least one magnetic layer.

According to another aspect of the present disclosure, there is provided a spintronic device comprising the spin valve according to any of the above exemplary embodiments.

In one embodiment, the spintronic device may be a magnetic memory, a spin transistor, a spin diode, a spin logic device, a spin oscillator, a magnetic sensor, or a temperature sensor.

BRIEF DESCRIPTION OF THE ACCOMPANYING DRAWINGS

DETAILED DESCRIPTION

Figure 1:
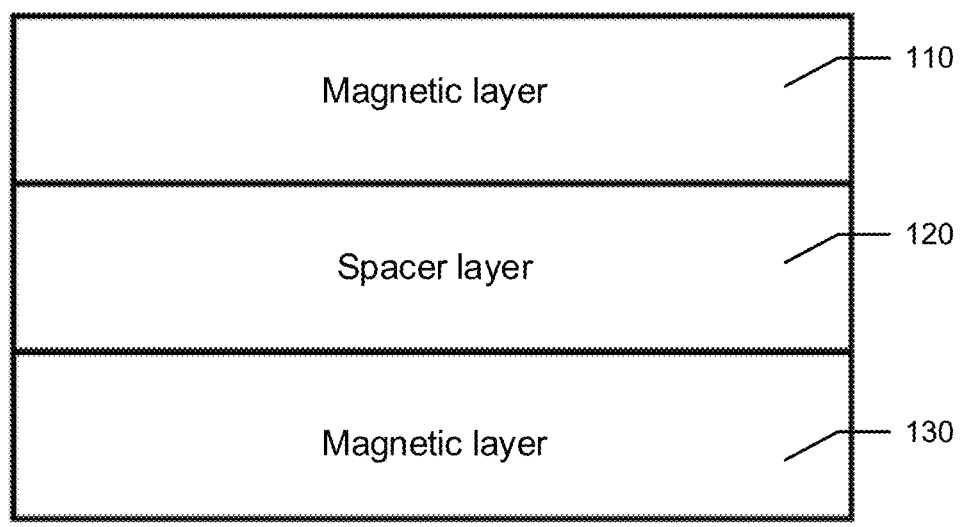
FIG. 1 illustrates a side view of a typical three-layered structure of a traditional spin valve.

Hereinafter, embodiments of the present disclosure will be described in detail with reference to the accompanying drawings. It should be understood that the description is only illustrative, and is not intended to limit the scope of the present disclosure. In the following detailed description, for ease of interpretation, many specific details are set forth to provide a comprehensive understanding of embodiments of the present disclosure. However, it is clear that one or more embodiments may also be implemented without these specific details. In addition, the well-known structure or technique will be omitted to avoid unnecessary confusion with the concept of the present disclosure.

The terms used herein are merely for the description of embodiments, and are not intended to limit the scope of the present disclosure. The terms "comprising", "including", etc. used herein indicate the presence of the feature, step, operation and/or part, but do not exclude the presence or addition of one or more other features, steps, operations or parts.

All terms used herein (including technical and scientific terms) have the meanings generally understood by those skilled in the art, unless otherwise defined. It should be noted that the terms used herein shall be interpreted to have meanings consistent with the context of the specification, and shall not be interpreted in an idealized or too rigid way.

In the case of using the expression similar to "at least one of A, B and C", it should be explained according to the meaning of the expression generally understood by those skilled in the art (for example, "a system having at least one of A, B and C" should include but not limited to a system having only A, a system having only B, a system having only C, a system having A and B, a system having A and C, a system having B and C, and/or a system having A, B and C). In the case of using the expression similar to "at least one of A, B or C", it should be explained according to the meaning of the expression generally understood by those skilled in the art (for example, "a system having at least one of A, B or C" should include but not limited to a system having only A, a system having only B, a system having only C, a system having A and B, a system having A and C, a system having B and C, and/or a system having A, B and C).

The present disclosure proposed a spin valve without spacer layer. A spin valve according to an exemplary embodiment of the present disclosure may comprise two or more magnetic layers stacked in sequence, wherein any two adjacent magnetic layers among the two or more magnetic layers have different coercive forces, and at least one of the any two adjacent magnetic layers is a magnetic layer made of a van der Waals material, which may be refereed as a van der Waals magnetic layer.

The coercive force refers to the strength of a magnetic field required to be applied to a saturation magnetized magnetic material for restoring its magnetic induction to zero. Generally, the saturation magnetized magnetic material have the magnetic induction which does not restore to zero when an original external magnetic field is removed. Indeed, the magnetic induction will restore to zero only if a certain amount of magnetic field is applied in an opposite direction of the original external magnetic field. The coercive force is related to the composition, thickness, shape, and the like of the magnetic material.

The van der Waals magnetic material refers to a material that is bonded by van der waal force between layers. The van der Waals junction may have a high-quality electronic interface. Since a van der Waals force is weak, there is no need to insert a spacer layer to decouple a van der Waals magnetic layer and another layer. Moreover, by using a van der Waals magnetic material to form a homo-junction or hetero-junction without direct chemical bonds, associated hybrid effect and defect-induced bound state can be avoided, thereby exhibiting properties beyond those of a traditional chemically bonded magnetic multilayer system.

Herein, a magnetic layer made of a van der Waals magnetic material may be referred to as a van der Waals magnetic layer, and a magnetic layer made of a magnetic material other than a van der Waals magnetic material may be referred to as a non-van der Waals magnetic layer.

Figure 2:
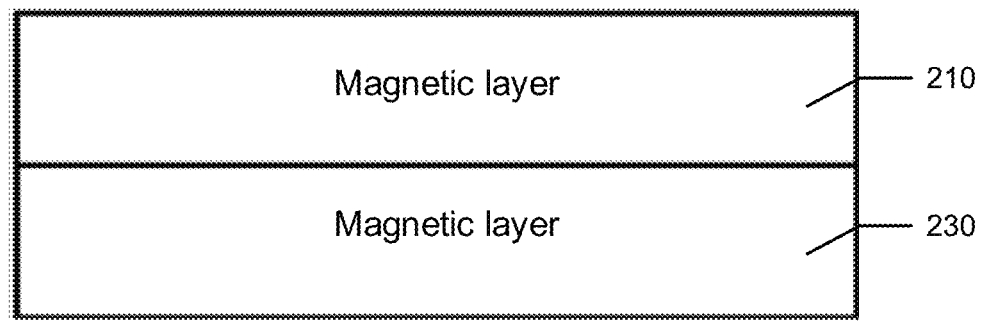
FIG. 2 illustrates a side view of a two-layered structure of a spin valve without spacer layer according to an exemplary embodiment of the present disclosure.
Figure 3:
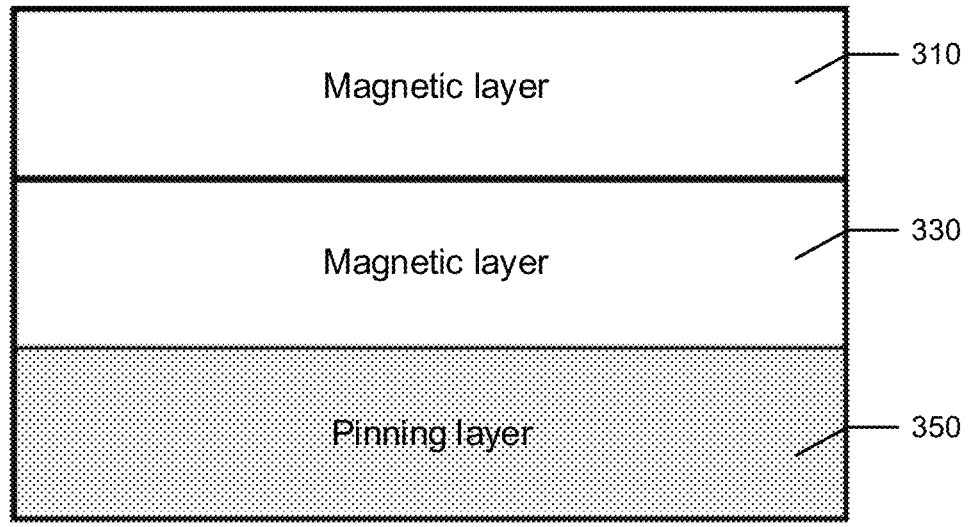
FIG. 3 illustrates a side view of a structure of a spin valve comprising a pinning layer according to an exemplary embodiment of the present disclosure.
Figure 4:
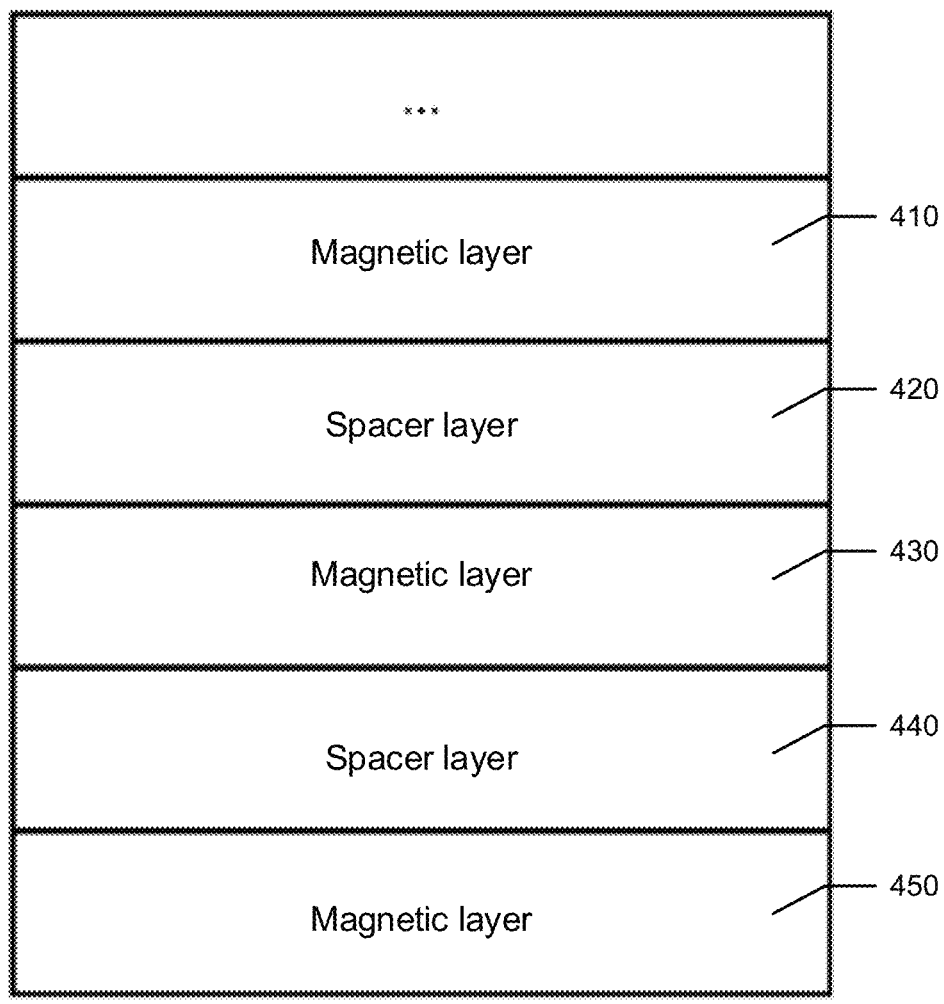
FIG. 4 illustrates a side view of a multilayered structure of a traditional multi-state spin valve.
Figure 5:
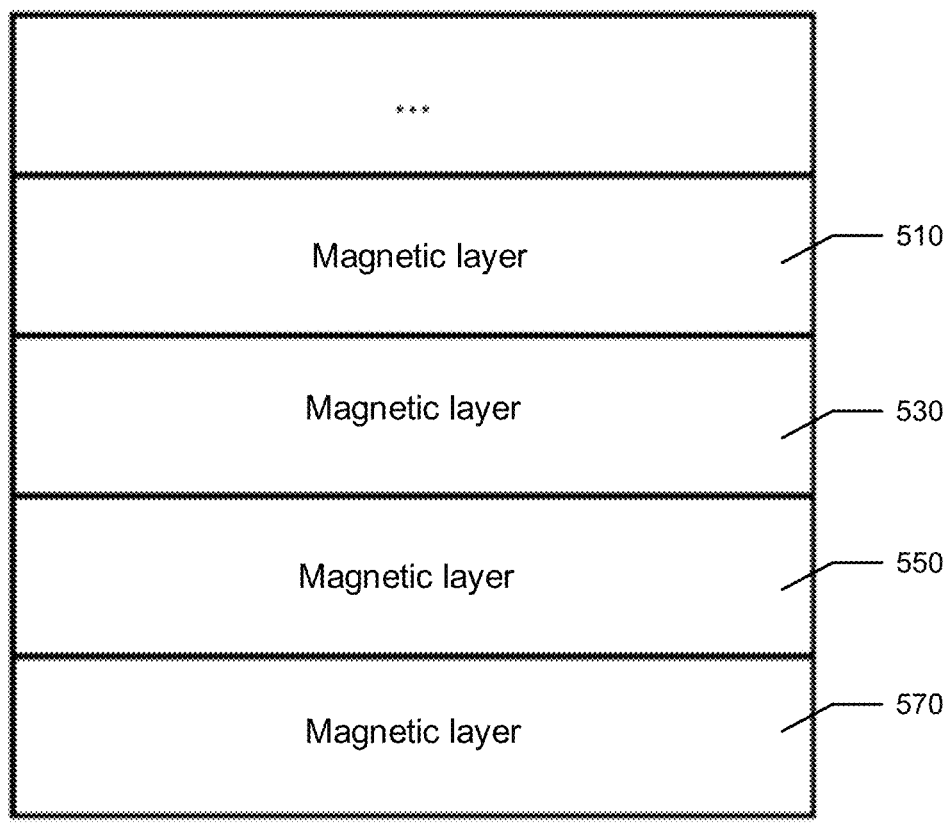
FIG. 5 illustrates a side view of a multilayered structure of a multi-state spin valve without spacer layer according to an exemplary embodiment of the present disclosure.
Figure 6:
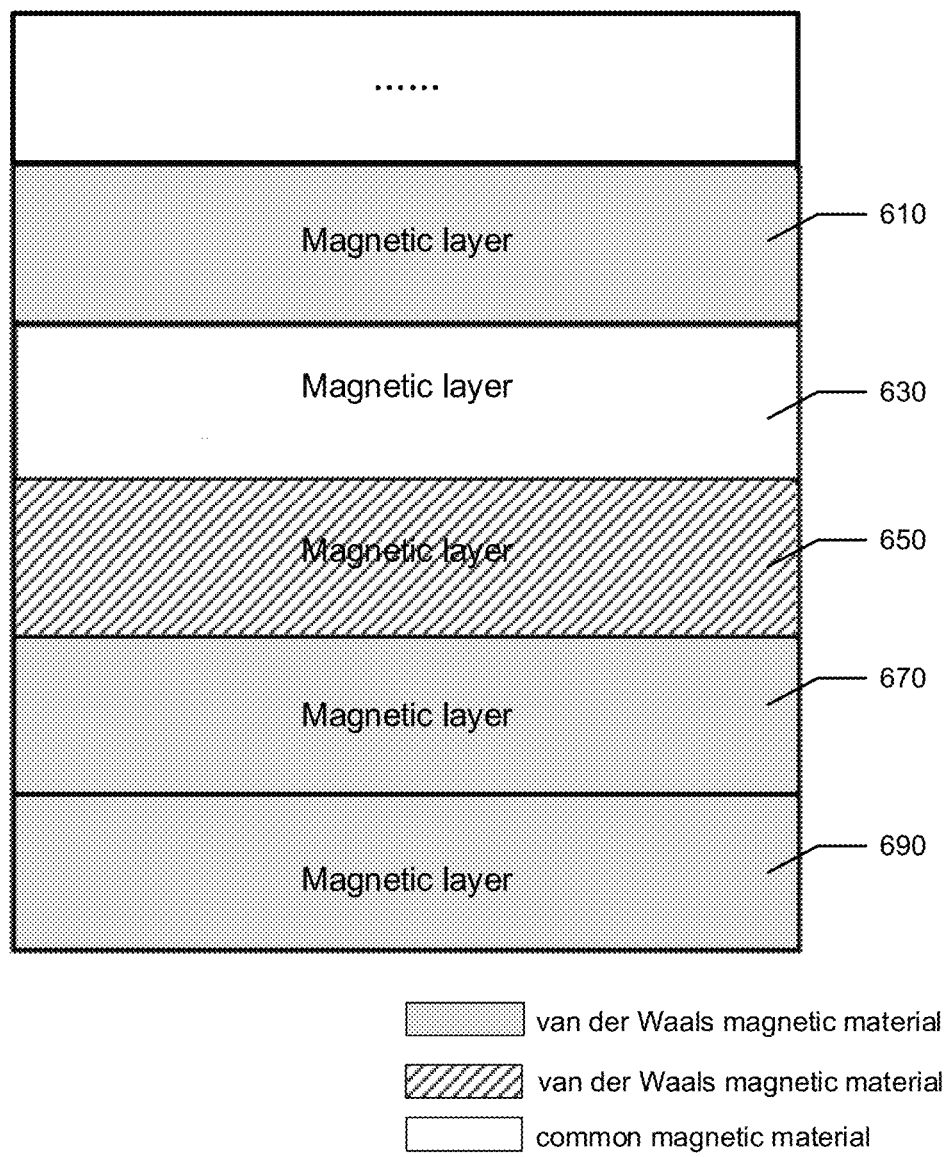
FIG. 6 illustrates a schematic diagram of a material composition of a multilayered structure of a multi-state spin valve without spacer layer according to an exemplary embodiment of the present disclosure.

FIG. 2 and FIG. 5 respectively illustrate an exemplary structure of a spin valve without spacer layer according to an exemplary embodiment of the present disclosure. FIG. 1 and FIG. 4 respectively illustrate an exemplary structure of a traditional spin valve corresponding to FIG. 2 and FIG. 5. FIG. 3 illustrates an exemplary structure of a spin valve comprising a pinning layer according to an exemplary embodiment of the present disclosure. In addition, FIG. 6 illustrates a schematic diagram of a material composition of a multilayered structure of a spin valve without spacer layer according to an exemplary embodiment of the present disclosure. Hereinafter, embodiments of the present disclosure will be described in detail with reference to the accompanying drawings.

FIG. 1 illustrates a side view of a typical three-layered structure of a traditional spin valve 100. As shown in FIG. 1, the traditional spin valve 100 has a sandwiched structure of "magnetic layer/spacer layer/magnetic layer", wherein the spacer layer 120 is disposed between a magnetic layer 110 and a magnetic layer 130 and used for magnetically decoupling. As described above, the introduction of the spacer layer may cause the spin momentum of electrons being scattered during passing through the spacer layer and the upper and lower interfaces between the spacer layer and the magnetic layer, resulting in a change in electron spin momentum and other problems.

FIG. 2 illustrates a side view of a structure of a spin valve without spacer layer 200 according to an exemplary embodiment of the present disclosure.

Referring to FIG. 2, the spin valve without spacer layer 200 may comprise a first magnetic layer 210 and a second magnetic layer 230 disposed under the first magnetic layer 210. Unlike the traditional spin valve 100 shown in FIG. 1, the spin valve in the present embodiment has no spacer layer between the magnetic layers, because in the present embodiment, one or both of the first magnetic layer 210 and the second magnetic layer 230 may be made of a van der Waals magnetic material.

In one embodiment, the first magnetic layer 210 and the second magnetic layer 230 may be made of the same van der Waals magnetic material with different thickness, shape, etc. to have different coercive forces.

In another embodiment, the first magnetic layer 210 and the second magnetic layer 230 may be made of different van der Waals magnetic materials and have different coercive forces.

In addition, in yet another embodiment, only one of the first magnetic layer 210 and the second magnetic layer 230 is made of a van der Waals magnetic material, and the other magnetic layer is made of a chemically bonded magnetic material, so that the two magnetic layers have different coercive forces.

No matter the first magnetic layer 210 and the second magnetic layer 230 are configured in which of the forms mentioned above, the first magnetic layer 210 and the second magnetic layer 230 need to have different coercive forces. In this case, an external magnetic field may be applied to enable the first magnetic layer 210 and the second magnetic layer 230 having a parallel configuration and antiparallel configuration, thereby generating a high or low magnetoresistance. This will further enable implementation of two different states of logic "0" and "1". In particular, in some embodiments, one of the first magnetic layer 210 and the second magnetic layer 230 may have a fixed magnetization direction, and the other magnetic layer may have an unfixed magnetization direction. In this case, the magnetization directions of the two layers may be provided with a parallel and antiparallel configuration by adjusting the magnetization direction of the other magnetic layer, thereby forming different two states. When one magnetic layer needs to be implemented as the magnetic layer with a fixed magnetization direction, the spin valve may additionally comprise a pinning layer to fix the magnetization direction of the magnetic layer, as shown in FIG. 3.

FIG. 3 illustrates a side view of a structure of a spin valve comprising a pinning layer according to an exemplary embodiment of the present disclosure. As shown in FIG. 3, the pinning layer 350 is disposed below the magnetic layer 330 to fix the magnetization direction of the magnetic layer 330. It should be clear to those skilled in the art that the position of the pinning layer is not limited thereto, and in fact, the pinning layer may be above and/or below the magnetic layer of which the magnetization direction needs to be fixed depending on requirements. In addition, various pinning materials (e.g., nickel oxide) that are known or will be known in the future may be used to form the pinning layer.

It should be noted that the van der Waals magnetic material employed in the above exemplary embodiments of the present disclosure may be implemented as at least one of a van der Waals magnetic metal, a van der Waals magnetic semimetal, a van der Waals magnetic semiconductor, a van der Waals magnetic superconductor, and a van der Waals magnetic insulator, or a mixture thereof; or may be implemented as a van der Waals ferromagnetic material and/or a van der Waals antiferromagnetic material; or may be implemented as a van der Waals in-plane magnetic anisotropic material and a van der Waals out-of-plane magnetic anisotropic material. In the embodiment where only one of the magnetic layers is made of the above van der Waals magnetic material, the other magnetic layer may be made of any magnetic layer, e.g., magnetic metal, semimetal, semiconductor, superconductor, insulator, ferromagnetic material, antiferromagnetic material, in-plane magnetic anisotropic material, and out-of-plane magnetic anisotropic material, or a combination thereof.

Although the inventive concept of the present disclosure is exemplarily illustrated with the spin valve comprising two magnetic layers with reference to FIG. 1 to FIG. 3, the inventive concept is not limited thereto, and the inventive concept of the present disclosure may also be applied for a multi-state spin valve.

FIG. 4 illustrates a side view of a multilayered structure of a traditional multi-state spin valve.

Similar to FIG. 1, a multi-state spin valve 400 shown in FIG. 4 comprises a plurality of magnetic layers, e.g., magnetic layers 410, 430 and 450; and a plurality of spacer layers, e.g., spacer layers 420 and 440, wherein each of the spacer layers is located between adjacent two magnetic layers to magnetically-decouple the adjacent two magnetic layers. In the multi-state spin valve 400, the multi-state is realized by providing the magnetic moment of each of the plurality of magnetic layers 410, 430 and 450 with parallel configuration and/or antiparallel configuration.

FIG. 5 illustrates a side view of a multilayered structure of a multi-state spin valve without spacer layer according to an exemplary embodiment of the present disclosure.

As shown in FIG. 5, similar to the spin valve without spacer layer 200 shown in FIG. 2, a multi-state spin valve without spacer layer 500 according to an exemplary embodiment of the present disclosure may comprise a plurality of magnetic layers 510, 530, 550 and 570 stacked in sequence, wherein at least one of adjacent two magnetic layers is made of a van der Waals magnetic material, and the adjacent two magnetic layers have different coercive forces. It may be seen that unlike the multi-state spin valve 400 shown in FIG. 4, the multi-state spin valve 500 has no spacer layer between the magnetic layers.

FIG. 6 illustrates a schematic diagram of a material composition of a multilayered structure of a multi-state spin valve 600 according to an exemplary embodiment of the present disclosure.

Specifically, in the case that both of adjacent magnetic layers are made of van der Waals magnetic material, they may be two magnetic layers made of same van der Waals magnetic material but having different coercive forces, e.g., magnetic layers 670 and 690. Alternatively, they may also be two magnetic layers made of different van der Waals magnetic materials and having different coercive forces, e.g., magnetic layers 650 and 670.

In the case that one of the adjacent two magnetic layers is made of a van der Waals magnetic material and the other magnetic layer may be made of a common magnetic material (for example, chemically bonded magnetic material), so as to form magnetic layers having different coercive forces, e.g., magnetic layers 360 and 650 or magnetic layers 360 and 610 as shown in FIG. 6. The common magnetic material may be any magnetic material other than a van der Waals magnetic material, for example, any of an organic magnetic material, an inorganic magnetic material, a magnetic metal, a semimetal, a semiconductor, a superconductor, an insulator, a ferromagnetic material, an antiferromagnetic material, an in-plane magnetic anisotropic material, and an out-of-plane magnetic anisotropic material, or a combination thereof.

In the multi-state spin valve without spacer layer 600 shown in FIG. 6, one or both of the adjacent magnetic layers may have an unfixed magnetization direction, so that the magnetic moments of the adjacent magnetic layers may be provided with a parallel configuration and antiparallel configuration by applying an external magnetic field, thereby realizing logic multi-states When some of the magnetic layers 610 to 690 are implemented as the magnetic layer(s) having a fixed magnetization direction, and the other are implemented as the magnetic layer(s) having an unfixed magnetization direction, the magnetic layer having an unfixed magnetization direction may be provided with a specific magnetization direction by controlling the external magnetic field. In one embodiment, when some of the magnetic layers need to be implemented as the magnetic layer(s) having a fixed magnetization direction, the spin valve may additionally comprise a pinning layer to fix the magnetization direction of these magnetic layer(s). The pinning layer has been described above with reference to FIG. 3, and therefore will not be described again here.

The spin valve without spacer layer according to an exemplary embodiment of the present disclosure has been described above. As mentioned above, the spin valve without spacer layer according to an exemplary embodiment of the present disclosure has few or no magnetic coupling between adjacent magnetic layers. It is not necessary to insert a spacer layer for magnetic decoupling of adjacent magnetic layers, thereby avoiding a series of technical problems and processing problems caused by introduction of the spacer layer. Therefore, the spin valve without spacer layer according to an exemplary embodiment of the present disclosure is of great significance for the development of magnetic sensing, data storage and processing technologies as well as related information industries. It should be noted that the thickness, shape, number, and the like of the magnetic layers in the drawings are illustrative and exemplary for explaining the present disclosure, and are not restrictive. The present disclosure is not limited thereto, and may include magnetic layers of other thickness, shape, number, and the like.

The spin valve without spacer layer according to the exemplary embodiment of the present disclosure may be applied to manufacture various spintronic devices, including but not limited to a magnetic memory, a spin transistor, a spin diode, a spin logic device, a spin oscillator, a magnetic sensor, or a temperature sensor. The spintronic device according to the exemplary embodiment of the present disclosure may be applied to all scenarios to which a traditional GMR spin valve or a TMR magnetic tunnel junction may be applied. Therefore, these specific applications are not described in detail here.

It should be understood that, since no spacer layer is required, as compared with a spintronic device comprising a traditional spin valve, the spintronic device comprising a spin valve without spacer layer according to the exemplary embodiment of the present disclosure not only has a small size and high integration, but also has stable performance and long life.

In addition, the terms used herein are merely for the purpose of describing the specific embodiments, and are not intended to limit the present disclosure. The words "a", "an" and "the" also include the meaning of "a plurality of" and "various", unless otherwise indicated clearly in the context. In addition, the terms "comprising", "including", etc. used herein indicate the presence of the features, steps, operations and/or parts, but do not exclude the presence or addition of one or more other features, steps, operations or parts.

It will be understood by those skilled in the art that the terms of ordinal words such as "first" and "second" may modify a variety of elements. However, these elements are not limited to the above words. For example, the above terms do not limit the order and/or importance of elements. The above terms are used only to distinguish one element from another element. For example, a first element may be referred to as a second element, and similarly, a second element may be referred to as a first element, without departing from the scope of the present disclosure.

The exemplary embodiments are described herein only for the purpose of explaining the present disclosure, not for limiting the scope of the present disclosure. As may be easily understood by those skilled in the art, all changes, modifications or equivalent replacements in any form and detail according to the concept and spirit of the present disclosure shall fall within the scope of the present disclosure. The scope of the present disclosure is defined by the appended claims and their equivalents.

We claim:

1. A spin valve comprising two or more magnetic layers stacked in sequence,
   wherein any two adjacent magnetic layers among the two or more magnetic layers have different coercive forces, and at least one of the any two adjacent magnetic layers is a van der Waals magnetic layer,
   wherein the van der Waals magnetic layer refers to a magnetic layer made of a van der Waals magnetic material,
   wherein at least one van der Waals magnetic layer among the two or more magnetic layers has a different van der Waals magnetic material from another van der Waals magnetic layer among the two or more magnetic layers.

2. The spin valve according to claim 1, wherein each van der Waals magnetic layer is made of the same van der Waals magnetic material.

3. The spin valve according to claim 1, wherein the van der Waals magnetic layer is made of at least one of: a van der Waals magnetic metal, a van der Waals magnetic semimetal, a van der Waals magnetic semiconductor, a van der Waals magnetic superconductor, a van der Waals magnetic insulator, a van der Waals ferromagnetic material, a van der Waals antiferromagnetic material, a van der Waals in-plane magnetic anisotropic material, a van der Waals out-of-plane magnetic anisotropic material, an organic van der Waals magnetic material, and an inorganic van der Waals magnetic material.

4. The spin valve according to claim 1, wherein a non-van der Waals magnetic layer among the two or more magnetic layers is made of at least one of: a magnetic metal, a magnetic semimetal, a magnetic semiconductor, a magnetic superconductor, a magnetic insulator, a ferromagnetic material, an antiferromagnetic material, an in-plane magnetic anisotropic material, an out-of-plane magnetic anisotropic material, an organic magnetic material, and an inorganic magnetic material.

5. The spin valve according to claim 1, wherein at least one of the two or more magnetic layers has a fixed magnetization direction, and other magnetic layer(s) have an unfixed magnetization direction.

6. The spin valve according to claim 1, further comprising a pinning layer disposed above and/or below the at least one magnetic layer, and configured to fix a magnetization direction of the at least one magnetic layer.

7. A spintronic device comprising the spin valve according to claim 1.

8. The spintronic device according to claim 7, wherein the spintronic device is a magnetic memory, a spin transistor, a spin diode, a spin logic device, a spin oscillator, a magnetic sensor, or a temperature sensor.

* * * * *